United States Patent
Suzuki et al.

(10) Patent No.: US 7,771,841 B2
(45) Date of Patent: *Aug. 10, 2010

(54) ULTRATHIN COPPER FOIL WITH CARRIER AND PRINTED CIRCUIT BOARD USING SAME

(75) Inventors: Yuuji Suzuki, Tochigi-ken (JP); Takami Moteki, Tochigi-ken (JP); Kazuhiro Hoshino, Tochigi-ken (JP); Satoshi Fujisawa, Tochigi-ken (JP); Akira Kawakami, Tochigi-ken (JP)

(73) Assignee: Furukawa Electric Co., Ltd., Tokyo (JP)

( * ) Notice: Subject to any disclaimer, the term of this patent is extended or adjusted under 35 U.S.C. 154(b) by 511 days.

This patent is subject to a terminal disclaimer.

(21) Appl. No.: 11/639,439

(22) Filed: Dec. 15, 2006

(65) Prior Publication Data

US 2007/0141381 A1    Jun. 21, 2007

(30) Foreign Application Priority Data

Dec. 15, 2005  (JP) ............................. 2005-361311
Nov. 8, 2006   (JP) ............................. 2006-303303

(51) Int. Cl.
*B32B 15/00* (2006.01)

(52) U.S. Cl. ..................... 428/675; 428/661; 428/668; 428/678

(58) Field of Classification Search ................. 428/209, 428/615, 661, 668, 675, 678, 901
See application file for complete search history.

(56) References Cited

U.S. PATENT DOCUMENTS 5,114,543 A * 5/1992 Kajiwara et al. ............ 205/152
6,183,880 B1 * 2/2001 Yoshioka et al. ............ 428/607
6,346,335 B1   2/2002 Chen et al.
7,026,059 B2 * 4/2006 Suzuki et al. ............... 428/626
7,132,158 B2 * 11/2006 Brenneman et al. ......... 428/336
7,175,920 B2 * 2/2007 Suzuki et al. ............... 428/615
2005/0089709 A1   4/2005 Brenneman et al.
2007/0212566 A1   9/2007 Sato

FOREIGN PATENT DOCUMENTS

| EP | 1 331 088 A1 | 7/2003 |
| EP | 1 511 366 A2 | 3/2005 |
| EP | 1 531 656 A2 | 5/2005 |
| JP | 2003-94553 A | 4/2003 |
| WO | 03/008671 A1 | 1/2003 |
| WO | 2006/013735 A1 | 2/2006 |

* cited by examiner

*Primary Examiner*—Cathy Lam

(57) ABSTRACT

An ultrathin copper foil with a carrier not causing blistering at a release layer interface, having a low carrier peeling force, friendly to the environment, and enabling easy peeling of a carrier foil and an ultrathin copper foil even under a high temperature environment and a printed circuit board enabling a stable production quality of a base of a printed circuit board for fine pattern applications using the ultrathin copper foil with the carrier, that is, a ultrathin copper foil with a carrier comprising a carrier foil, a diffusion prevention layer, a release layer, and an ultrathin copper foil, wherein the release layer is formed by a metal A for retaining a release property and a metal B for facilitating plating of the ultrathin copper foil, a content a of the metal A and a content b of the metal B forming the release layer satisfying an equation:

$$10 \leq a/(a+b)*100 \leq 70$$

and a printed circuit board prepared by using such a ultrathin copper foil with a carrier.

6 Claims, No Drawings

US 7,771,841 B2

ULTRATHIN COPPER FOIL WITH CARRIER AND PRINTED CIRCUIT BOARD USING SAME

BACKGROUND OF THE INVENTION

1. Field of the Invention

The present invention relates to an ultrathin copper foil with a carrier and a printed circuit board using the ultrathin copper foil with the carrier, more particularly relates to an ultrathin copper foil with a carrier suitable for a printed circuit board for high density ultrafine circuit (fine pattern) applications, a multi-layer printed circuit board, and a chip-on-film use circuit board.

2. Description of the Related Art

Usually, in the copper foil used for a printed circuit board forming the base of a printed circuit board, a multi-layer printed circuit board, a chip-on-film use circuit board, or the like, a surface on the side heat pressed to a plastic substrate or the like is formed as a roughened surface and this roughened surface is used to manifest an anchor effect with respect to the substrate so as to raise a bond strength between the substrate and the copper foil and thereby to secure reliability as a printed circuit board.

Further, recently, copper foil with a resin layer formed by covering the roughened surface of copper foil by a bonding use resin such as an epoxy resin in advance and using the bonding use resin as an insulating resin layer of a semi-cured state (B stage) is used as copper foil for forming interconnects. The side with the insulating resin layer is hot pressed to a substrate to form a printed circuit board. Such printed circuit boards are stacked in multiple layers to thereby produce a builtup circuit board. A builtup circuit board is one type of multi-layer printed circuit board and is obtained by forming an insulating layer and a conductive pattern on the insulating substrate one layer at a time in that order, plating holes (vias) formed by a laser process or a photo process, and stacking such circuit layers while connecting the layers.

In this circuit board, the vias can be made finer corresponding to the higher integration of various types of electronic devices. Therefore, interconnect patterns are increasingly being required to be made finer in line widths and line pitches. For example, in the case of printed circuit boards used in semiconductor packages, provision of printed circuit boards having high density ultrafine interconnects having line widths and line pitches of approximately 30 µm is being demanded.

When using thick copper foil as the copper foil for such a fine pattern printed circuit board, an etching time at the time of formation of the interconnects and circuits by etching becomes long. As a result, a verticalness of side walls of the formed interconnect patterns is lost. When the interconnect line widths of the formed interconnect patterns are narrow, this sometimes leads to disconnection. Accordingly, as the copper foil used for fine pattern applications, copper foil having a thickness of 9 µm or less is required. At present, copper foil having a thickness of about 5 µm is most frequently used. Further thinner copper foil is being sought.

However, such thin copper foil (hereinafter sometimes also referred to as "ultrathin copper foil") has a weak mechanical strength, is easily wrinkled or creased at the time of the production of the printed circuit board, and sometimes even breaks. Therefore, as the ultrathin copper foil used for the fine pattern applications, use is made of an ultrathin copper foil with a carrier formed by directly electrodepositing an ultrathin copper foil layer on one surface of metal foil serving as a carrier (hereinafter, referred to as "carrier foil") via a release layer.

As explained above, the copper foil having a thickness of 5 µm which is frequently used at present is provided as the ultrathin copper foil with the carrier.

An ultrathin copper foil with a carrier has a carrier foil on one surface of which a release layer and ultrathin copper foil deposited by electric copper plating are formed in that order. The outermost layer surface of the ultrathin copper foil made of the electric copper plating is finished to a roughened surface.

As the release layer formed on the one surface of the carrier foil, an organic coating film, Cr metal, Cr alloy, chromate, etc. are usually used, but in recent years in interconnect substrates using a polyamide or other high temperature plastic etc. as the insulating substrate, the conditions such as the pressing temperature of the copper foil and the substrate or the curing temperature are high temperature, therefore an organic release layer can no longer be peeled off. Therefore, an organic coating film cannot be used, and a metal-based release layer is used instead.

As the metal for forming the release layer, as described before, a Cr metal, Cr alloy, and chromate form the mainstream. However, when using Cr for the release layer, blistering occurs in the high temperature process of production of the interconnect substrates, variation occurs in the release properties, and some problem arises in stability of production of the interconnect substrates.

Further, some metals such as Cr reportedly exert an adverse influence upon the human body. A future ban on use of these metals may even be expected. Accordingly, in actual circumstances, the use of a metal such as Cr must be prevented as much as possible.

Summarizing the problems in the art, as explained above, a release layer using Cr results in insufficient stability of high temperature production of the interconnect substrates. The appearance of the ultrathin copper foil with the carrier using a release layer not using Cr metal liable to have an effect on the human body or suppressing the content of Cr to the smallest limit and enabling easy release even under a high temperature has therefore been desired.

SUMMARY OF THE INVENTION

An object of the present invention is to provide a ultrathin copper foil with a carrier suppressing the occurrence of blistering, not exerting an influence upon carrier peeling, having a wide range of possible production conditions, stable in production quality, friendly to the environment, and enabling easy peeling of the carrier foil and the ultrathin copper foil even when placed in a high temperature environment.

Another object of the present invention is to provide a printed circuit board forming the base of a printed circuit board for fine pattern applications using the ultrathin copper foil with the carrier, a multi-layer printed circuit board, a chip-on-film use circuit board, or the like.

A first ultrathin copper with a carrier foil of the present invention is a ultrathin copper foil with a carrier comprising a carrier foil, a diffusion prevention layer, a release layer, and an ultrathin copper foil, wherein the release layer includes a metal A for retaining a release property and a metal B for facilitating plating of the ultrathin copper foil, and a content a of the metal A and a content b of the metal B constituting the release layer satisfy an equation:

$$10 \leq a/(a+b)*100 \leq 70 (\%)$$

A second ultrathin copper foil with a carrier of the present invention is a ultrathin copper foil with a carrier comprising a carrier foil, a diffusion prevention layer, release layers, and an ultrathin copper foil, wherein the release layers are comprised of two layers having different composition ratios of a metal A for retaining a release property and a metal B for facilitating plating of the ultrathin copper foil, and, when the content of the metal A constituting a release layer on the diffusion layer side is c, the content of the metal B thereof is d, the content of the metal A constituting a release layer on the ultrathin copper foil side is e, and the content of the metal B thereof is f, an equation of:

$$|c/(c+d)-e/(e+f)|*100\geqq3(\%)$$

is satisfied.

Preferably, the metal A constituting the release layers is selected from a group consisting of Mo, Ta, V, Mn, W, and Cr, and the metal B is selected from a group consisting of Fe, Co, Ni, and Cr.

Preferably, a total of the amount(s) of deposition of the release layer(s) is 0.05 mg/dm$^2$ to 50 mg/dm$^2$.

The printed circuit board of the present invention is a printed circuit board for high density ultrafine interconnect applications comprising the ultrathin copper foil with the carrier with the ultrathin copper foil laminated on a resin substrate.

According to the present invention, therefore, an ultrathin copper foil with a carrier suppressing the occurrence of blistering, not exerting an influence upon carrier peeling, having a wide range of possible production conditions, stable in production quality, friendly to the environment, and enabling easy peeling of the carrier foil and the ultrathin copper foil even when placed in a high temperature environment can be provided.

Further, according to the present invention, a printed circuit board forming the base of a printed circuit board for fine pattern applications using the ultrathin copper foil with the carrier, a multi-layer printed circuit board, a chip-on-film use circuit board, or the like can be provided.

DESCRIPTION OF THE PREFERRED EMBODIMENTS

As the metal carrier foil for an ultrathin copper foil with a carrier, generally use can be made of aluminum foil, aluminum alloy foil, stainless steel foil, titanium foil, titanium alloy foil, copper foil, copper alloy foil, and so on. From the viewpoint of the convenience of handling of the carrier foil used as the ultrathin copper foil or copper alloy foil (hereinafter referred to all together as "ultrathin copper foil" when not necessary to differentiate these), preferably use is made of electrolytic copper foil, electrolytic copper alloy foil, rolled copper foil, or rolled copper alloy foil. Further, as the thickness thereof, preferably use is made of foil having a thickness of 7 μm to 200 μm.

When employing thin copper foil having a thickness of less than 7 μm as the carrier foil, since this carrier foil is weak in mechanical strength, it easily wrinkles and creases and is liable to tear at the time of production of printed circuit boards etc. Further, when the thickness of the carrier foil exceeds 200 μm, an increase of weight per unit coil (coil unit weight) exerts a big influence upon the productivity. At the same time, a larger strength is required facility wise as well. The facility ends up becoming large in size, so this is not preferred. Accordingly, as the thickness of the carrier foil, 7 μm to 200 μm is preferred.

As the carrier foil, preferably use is made of a metal foil having a surface roughness Rz of at least one side of 0.01 μm to 5.0 μm. Particularly, in a case where visual recognizability on a chip-on-film use circuit board is required, preferably the Rz is 0.01 μm to 2.0 μm. For this reason, when visual recognizability on a chip-on-film use circuit board is required, when using a carrier foil having a range of surface roughness Rz of 2 μm to 5.0 μm, mechanical polishing or electrolytic polishing may be applied to the rough surface in advance to smooth the surface for use so that the surface roughness Rz becomes 0.01 μm to 2 μm in range. Note that it is also possible to previously apply mechanical polishing and/or electrochemical dissolution to carrier foil having a surface roughness Rz of 5 μm or more so as to smooth it for use.

In the present invention, in order to stabilize a heat resistance of the release layer explained later with respect to the release property, a diffusion prevention layer is provided between the release layer and the carrier foil. The diffusion prevention layer is preferably formed by Ni or its alloy. Note that formation by Cr or a Cr alloy is also effective.

In the present invention, the release layer provided on the diffusion prevention layer is constituted by a metal and a nonmetallic or metallic oxide or alloy mixed together. Particularly, the release layer of the present invention is constituted by a metal A for retaining the release property and a metal B facilitating the plating of the ultrathin copper foil.

The metal A constituting the release layer is selected from a group consisting of Mo, Ta, V, Mn, W, and Cr.

Further, the metal B is selected from a group consisting of Fe, Co, Ni, and Cr.

Note that Cr metal has environmental problems, therefore particularly preferably as much as possible it is not used at all or, even if used, the amount of use is suppressed to the required lowest limit.

More specifically, the release layer includes the metal A for retaining the release property and the metal B for facilitating the plating of the ultrathin copper foil wherein the content a of the metal A and the content b of the metal B constituting the release layer satisfy the equation:

$$10\leqq a/(a+b)*100\leqq70$$

Note that by making this ratio a/(a+b)*100 a range from 20 to 70, more excellent effects are obtained.

Alternatively, there are two release layers having different composition ratios of the metal A for retaining the release property and the metal B for facilitating the plating of the ultrathin copper foil, and, when the content of the metal A constituting the release layer on the diffusion layer side is c, the content of the metal B thereof is d, the content of the metal A constituting the release layer on the ultrathin copper foil side is e, and the content of the metal B thereof is f, the equation of:

$$|c/(c+d)-e/(e+f)|*100\geqq3(\%)$$

is satisfied.

Note that the effects are further improved when the layers satisfy the equations of:

$$10\leqq c/(c+d)*100\leqq70 \text{ and}$$

$$10\leqq e/(e+f)*100\leqq70$$

The above two layers, or layers more than that, may also be realized by a change of the composition ratios between the carrier foil surface side and the ultrathin copper foil side due to the plating conditions rather than a deliberate change of the compositions. If a difference of upper and lower composition ratios is 3% or more in the thicknesses of 0.1% to 5% of the overall deposition amounts from the carrier foil side and the ultrathin copper foil side, effects equivalent to those by deliberately changing the compositions of two layers are created.

When providing two release layers constituted by different types of metals, equivalent effects can be created if the metal species belonging to the metal A and the metal species belonging to the metal B are in the above ranges of composition ratios.

In the present invention, the total of the deposition amounts of the deposited release layers is preferably 0.05 mg/dm$^2$ to 50 mg/dm$^2$.

If the total of the deposition amounts is less than 0.05 mg/dm$^2$, the layers do not sufficiently function as release layers, while even when the total of the deposition amounts exceeds 50 mg/dm$^2$, while the layers can be peeled off, the metal species forming the release layers is a hard-to-plate metal, therefore if the layers are formed thick, the smoothness is lost, variation is seen in peeling force, the stability is lost, and blistering is even caused, so preferably the total is 50 mg/dm$^2$ or less. Further, when considering also the smoothness of the surface of the ultrathin copper foil, the total is preferably 20 mg/dm$^2$ or less. Further, preferably the roughness of the release layer surface is 1.5 times or less the roughness of the carrier foil surface, and also the surface area is 1.5 times or less the surface area of the carrier foil. This is because when the surface roughness and the surface area become large, these overall make the carrier peeling force large and also make the variation large.

In the present invention, the thickness in the case where there are two release layers is 0.05 mg/dm$^2$ to 50 mg/dm$^2$ in terms of the total deposition amount of the two layers in the same way as that described above. In particular, the release property tends to be improved more in the case where the deposition amount of the second layer on the ultrathin copper foil side is smaller than the deposition amount of the first layer on the carrier foil side.

Further, for preventing oxidation of the ultrathin copper foil surface, a release layer may be provided with an antioxidation layer made of a low melting point metal. The low melting point metal is a metal having a melting point of 450° C. or less alone or its alloy. Specifically, depositing Zn, Sn, Bi, In, or an alloy containing as a principal ingredient one element among Zn, Sn, Pb, Bi, and In has an effect of suppressing discoloration of the ultrathin copper foil surface due to oxidation, so is preferred.

Further, the effect of this low melting point metal is to facilitate adhesion of the release layer and the thin copper foil under ordinary conditions and therefore help suppress plating defects (pinholes) of the thin copper foil and blistering when performing heat treatment. Further, when adhering this to a polyimide, heat is applied and the low melting point metal diffuses in the surface of the thin copper foil, therefore, spaces are formed between the release layer and the thin copper foil and therefore the carrier peeling force is lowered. Although differing according to the metal species, preferably the deposition amount of the low melting point metal on the release layer is 0.01 mg/dm$^2$ or more, more particularly 0.05 mg/dm$^2$ to 10 mg/dm$^2$. The plating bath for depositing the low melting point metal is not particularly limited. A commercially available plating solution can be used.

The ultrathin copper foil is formed on the release layer by electrolytic plating using a copper sulfate bath, copper pyrophosphate bath, copper sulfamate bath, copper cyanide bath, or the like. Note that, as the plating bath, preferably use is made of a copper plating bath having a pH within a range of 1 to 12.

In the formation of the ultrathin copper foil, when the release layer is formed by Zn or another metal which is easily dissolved in the plating solution, the dip time and/or current value in the plating solution, the removal of the plating solution and/or rinsing in the plating finishing step, the pH of the plating solution immediately after the metal plating, etc. determine the residual state of the release layer, therefore the bath type must be selected according to the relationship between the release layer surface and the metal formed on that.

Further, in the formation of ultrathin copper foil on a release layer, it is very difficult to perform uniform plating due to the release property of the release layer, therefore, as a result, there are sometimes many pinholes in the ultrathin copper foil. At the time of such a plating condition, by first performing strike copper plating, then performing the usual electrolytic plating, the release layer can be uniformly plated and the number of pinholes formed in the ultrathin copper foil can be sharply decreased.

The thickness of the copper plating deposited by the strike plating is preferably 0.01 μm to 1 μm. There are a variety of conditions depending on the bath types, but preferably the current density is 0.1 A/dm$^2$ to 20 A/dm$^2$, and the plating time is 0.1 second or more. If the current density is less than 0.1 A/dm$^2$, it is difficult to uniformly plate the release layer, while when it exceeds 20 A/dm$^2$, in strike plating reducing the metal concentration of the plating solution, a burnt plating occurs and a uniform copper plating layer is not obtained, so this is not preferred. A plating time less than 0.1 second is too short to obtain a sufficient plating layer, so is not preferred.

After forming a copper plating layer having a thickness of 0.01 μm or more not degrading the release property of the release layer on the release layer by strike plating, copper is plated to a desired thickness to thereby obtain an ultrathin copper foil.

Further, when including P in the ultrathin copper foil surface, the adhesion with the release layer is weakened, therefore the peeling strength becomes smaller. Accordingly, in order to adjust the peeling strength, it is effective to include P in the ultrathin copper foil surface.

Note that in order to obtain greater strength adhesion with the insulating substrate at the ultrathin copper foil surface, the surface of the ultrathin copper foil may be roughened to give a roughness of the surface Rz of 0.2 to 3.0 (μm). This is because, if the roughness is less than 0.2 (μm), the roughening does not influence the adhesion so much, therefore is meaningless, while when the roughness is 3 (μm), a sufficient adhesion is obtained, therefore roughening exceeding that is not required.

Finally, Ni and Zn having effects for rust prevention and heat resistance or, according to a certain case, Cr are deposited onto the roughened surface. Further, in order to improve the peel strength, the coating of silane is effective.

EXAMPLES

Below, the present invention will be specifically explained according to examples.

The plating conditions of the examples are as follows.
(1) Copper Plating Conditions
<Copper Plating Conditions 1>
$Cu_2P_2O_7 3H_2O$: 3 to 50 g/liter
$K_4P_2O_7$: 50 to 350 g/liter
pH: 8 to 11
Current density: 0.1 to 5 A/dm$^2$
<Copper Plating Conditions 2>
$Cu_2P_2O_7 3H_2O$: 10 to 150 g/liter
$K_4P_2O_7$: 50 to 400 g/liter NH$_3$OH (28%): 1 to 10 ml/l
pH: 8 to 12
Bath temperature: 20 to 60° C.
<Copper Plating Conditions 3>
Copper sulfate (as Cu metal): 10 to 70 g/dm$^3$
Sulfuric acid: 30 to 120 g/dm$^3$
Current density: 1 to 60 A/dm$^2$
Power supply time: 1 second to 2 minutes
Bath temperature: 10 to 70° C.
(2) Nickel Plating Conditions
Nickel sulfate (as Ni): 1 to 120 g/dm$^3$
Boric acid: 10 to 50 g/dm$^3$
Current density: 1 to 60 A/dm$^2$
Power supply time: 1 second to 2 minutes
Bath temperature: 10 to 70° C.
(3) Ni—Co Plating Conditions
Nickel sulfate (as Ni): 5 to 120 g/dm$^3$
Cobalt sulfate (as Co metal): 0.5 to 40 g/dm$^3$
pH: 2 to 4
Current density: 0.5 to 10 A/dm$^2$
Time: 1 second to 2 minutes
(4) Mo—Co Plating Conditions
Co amount: 0.1 to 20 g/dm$^3$
Mo amount: 0.05 to 20 g/dm$^3$
Citric acid: 5 to 240 g/dm$^3$
Current density: 0.1 to 60 A/dm$^2$
Power supply time: 1 second to 5 minutes
Bath temperature: 10° C. to 70° C.
(5) Mo—Ni Plating Conditions
Ni sulfate hexahydrate: 10 to 100 g/dm$^3$
Sodium molybdate dihydrate: 10 to 100 g/dm$^3$
Sodium citrate: 30 to 200 g/dm$^3$
Bath temperature: 10 to 50° C.
Current density: 0.5 to 15 A/dm$^2$
(6) W—Ni Plating Conditions
Ni sulfate hexahydrate: 10 to 100 g/dm$^3$
Sodium tungstate dihydrate: 10 to 100 g/dm$^3$
Sodium citrate: 30 to 200 g/dm$^3$
Bath temperature: 30 to 90° C.
Current density: 0.5 to 15 A/dm$^2$ Example 1

Production of Ultrathin Copper Foil with Carrier by Carrier Foil→Ni (Diffusion Prevention Layer)→Mo—Co (Release Layer)→Copper Plating (Ultrathin Copper Foil)

A copper foil having one surface with an Rz of 0.8 μm (thickness: 31 μm) was used as the carrier foil. A diffusion prevention layer was applied onto the carrier foil under the above Nickel Plating Conditions, then a release layer was formed by Mo—Co plating under the following conditions:
Co amount: 4.0 g/dm$^3$
Mo amount: 2.0 g/dm$^3$
Citric acid: 80 g/dm$^3$
Current density: 2 A/dm$^2$
Power supply time: 15 seconds
Bath temperature: 50° C.

The deposition amount of the formed release layer was 1.5 mg/dm$^2$, and Mo/(Mo+Co)*100 was equal to 31(%).

The formed release layer was plated with copper to a thickness of 0.2 μm under the above Copper Plating Conditions 1, then was plated with copper over that according to the above Copper Plating Conditions 3 with a current density of 4.5 A/dm$^2$ to form an ultrathin copper foil having a thickness of 3 μm and thereby obtain an ultrathin copper foil with a carrier.

Then, the surface was treated by Ni: 0.5 mg/dm$^2$, Zn: 0.05 mg/dm$^2$, and Cr: 0.3 mg/dm$^2$, then was treated by a silane coupling agent (post-treatment) to obtain the ultrathin copper foil with the carrier.

Example 2

Production of Ultrathin Copper Foil with Carrier by Carrier Foil→Ni (Diffusion Prevention Layer)→Mo—Ni (Release Layer)→Copper Plating (Ultrathin Copper Foil)

A copper foil having one surface with an Rz of 0.85 μm (thickness: 31 μm) was used as the carrier copper foil. This was plated under the above Nickel Plating Conditions, then was plated under the following conditions to prepare an Mo—Ni plating layer:
Ni sulfate hexahydrate: 50 g/dm$^3$
Sodium molybdate dihydrate: 60 g/dm$^3$
Sodium citrate: 90 g/dm$^3$
Bath temperature: 30° C.
Current density: 3 A/dm$^2$
Power supply time: 20 seconds The deposition amount of the prepared release layer was 2.4 mg/dm$^2$, and Mo/(Mo+Ni)*100 was equal to 29(%)

The release layer was formed with a copper plating layer having a thickness of 0.2 μm according to the Copper Plating Conditions 1, then was further formed with a copper plating layer by plating having a current density of 4.5 A/dm$^2$ by using the Copper Plating Conditions 3 to form an ultrathin copper foil having a thickness of 3 μm and obtain an ultrathin copper foil with the carrier.

Then, the surface was treated by Ni: 0.5 mg/dm$^2$, Zn: 0.05 mg/dm$^2$, and Cr: 0.3 mg/dm$^2$ and was treated by a silane coupling agent (post-treatment) to obtain the ultrathin copper foil with the carrier.

Example 3

Production of Ultrathin Copper Foil with Carrier by Carrier Foil→Ni (Diffusion Prevention Layer)→W—Ni (Release Layer)→Copper Plating (Ultrathin Copper Foil)

A copper foil having one surface with an Rz of 0.82 μm (thickness: 31 μm) was used as the carrier copper foil. This was plated under the Nickel Plating Conditions, then was plated under the following conditions to prepare a W—Ni layer:
Ni sulfate hexahydrate: 50 g/dm$^3$
Sodium tungstate dihydrate: 60 g/dm$^3$
Sodium citrate: 90 g/dm$^3$
Bath temperature: 70° C.
Current density: 2.5 A/dm$^2$
Power supply time: 18 seconds The deposition amount of the prepared release layer was 1 mg/dm$^2$, and W/(W+Ni)*100=20%

The release layer was plated with copper to a 0.2 μm thickness according to the above Copper Plating Conditions 1, then was further plated with a current density of 3.5 A/dm$^2$ under the Copper Plating Conditions 3 to form an ultrathin copper foil having a thickness of 3 μm and thereby obtain an ultrathin copper foil with a carrier.

Example 4

Production of Ultrathin Copper Foil with Carrier by Carrier Foil →Ni (Diffusion Prevention Layer)→Mo—Co (First Layer)→Mo—Co (Second Layer) (Release Layer)→Copper Plating (Ultrathin Copper Foil)

A copper foil having one surface with an Rz of 0.74 μm (thickness: 22 μm) was used as the carrier copper foil. This was plated under the Nickel Plating Conditions, then was plated under the following conditions to prepare Mo—Co plating layers:

<First Layer Plating Conditions>
Co amount: 4.0 g/dm$^3$
Mo amount: 3.0 g/dm$^3$
Citric acid: 80 g/dm$^3$
Current density: 2 A/dm$^2$
Power supply time: 10 seconds
Bath temperature: 50° C.
<Second Layer Plating Conditions>
Co amount: 4.0 g/dm$^3$
Mo amount: 1.5 g/dm$^3$
Citric acid: 80 g/dm$^3$
Current density: 2 A/dm$^2$
Power supply time: 5 seconds
Bath temperature: 50° C.

The total deposition amount of the release layers (first layer+second layer): 2.3 mg/dm$^2$, and First layer of Mo/(Mo+Co)*100=56%, and
Second layer of Mo/(Mo+Co)*100=23% were formed.

The release layers were formed with copper plating to 0.2 μm thickness by the Copper Plating Conditions 1, then were further plated using the Copper Plating Conditions 3 with a current density of 3.5 A/dm$^2$ to form an ultrathin copper foil having a thickness of 3 μm and thereby obtain the ultrathin copper foil with the carrier.

Then, the surface was treated with Ni: 0.5 mg/dm$^2$, Zn: 0.05 mg/dm$^2$, and Cr: 0.3 mg/dm$^2$, then as treated with a silane coupling agent (post-treatment) to obtain an ultrathin copper foil with a carrier.

Example 5

The same treatment as that in Example 1 was carried out to obtain an ultrathin copper foil with a carrier except the diffusion prevention layer was changed to Ni—Co.

Example 6

The same treatment as that in Example 2 was carried out to obtain an ultrathin copper foil with a carrier except the diffusion prevention layer was changed to Ni—Co.

Example 7

The same treatment as that in Example 3 was carried out to obtain an ultrathin copper foil with a carrier except the diffusion prevention layer was changed to Ni—Co.

Example 8

The same treatment as that in Example 4 was carried out to obtain an ultrathin copper foil with a carrier except the diffusion prevention layer was changed to Ni—Co.

Example 9

The same routine as that in Example 1 was carried out up to the formation of the release layer (Mo—Co), then the release layer was plated with zinc as the low melting point metal in an amount of 0.3 mg/dm$^2$ under the following plating conditions to thereby obtain an ultrathin copper foil with a carrier.

The zinc was plated on the release layer under:
Zn metal concentration: 1 to 40 g/dm$^3$
NaOH: 3 to 100 g/dm$^3$
Temperature: 10 to 60° C.
Current density: 0.1 to 10 A/dm g/dm$^2$

Comparative Example 1

1. Carrier Foil
A copper foil having a surface roughness Rz of the carrier foil of 1.2 μm was used as the carrier foil.
2. Formation of Release Layer
Cr metal was deposited onto the carrier copper foil to form a release layer.
3. Formation of Ultrathin Copper Foil
The release layer was plated with copper to a thickness of 1 μm under the conditions of:
Cu$_2$P$_2$O$_7$.3H$_2$O: 30 g/liter
K$_4$P$_2$O$_7$: 300 g/liter
pH: 8
Current density: 4 A/dm$^2$, then was electroplated under the conditions of:
Cu concentration: 50 g/liter
H$_2$SO$_4$: 100 g/liter
Current density: 20 A/dm$^2$ to obtain an ultrathin copper foil having a thickness of 3 μm. This was further roughened by depositing particles of copper according to a known method.

The roughened ultrathin copper layer was plated by zinc and treated by chromate according to known methods as the rust prevention treatment and surface treatment to obtain an ultrathin copper foil with a carrier.

Comparative Example 2

1. Carrier Foil
A copper foil having a surface roughness Rz of the carrier foil of 1.2 μm was used as the carrier foil.
2. Formation of Release Layer
The carrier copper foil was electroplated by Cr continuously to form a Cr plated release layer having a deposition amount of 1.5 mg/dm$^2$. A hydrated oxide was formed on the surface layer.
3. Formation of Ultrathin Copper Foil
This Cr plated release layer was plated with copper by strike plating for 60 seconds under the conditions of:
Cu$_2$P$_2$O$_7$.3H$_2$O: 30 g/liter
K$_4$P$_2$O$_7$: 300 g/liter
pH: 8
Current density: 1.5 A/dm$^2$, then was plated with copper to a thickness of 1 μm under the conditions of:

Cu$_2$P$_2$O$_7$.3H$_2$O: 30 g/liter
K$_4$P$_2$O$_7$: 300 g/liter
pH: 8
Current density: 4 A/dm$^2$, then was electroplated under the conditions of:

Cu concentration: 50 g/liter
H$_2$SO$_4$: 100 g/liter
Current density: 20 A/dm$^2$ to obtain an ultrathin copper foil having a thickness of 3 μm and further was roughened by depositing particles of copper according to a known method.

The roughened ultrathin copper layer was plated by zinc and treated by chromate according to known methods as the rust prevention treatment and surface treatment to obtain an ultrathin copper foil with a carrier.

<Evaluation>

Samples for evaluation of the carrier peeling force of the ultrathin copper foils with carriers prepared in the above examples and comparative examples were prepared and evaluated as follows.

(1) Samples for Measurement of Carrier Peeling Force and Confirmation of Blistering The ultrathin copper foils with carriers (Examples 1 to 9 and Comparative Examples 1 and 2) were cut into pieces each having a size of 250 mm in the vertical direction and 250 mm in the horizontal direction. These were then heated at a temperature of 350° C. for 10 minutes to prepare samples for confirmation of blistering.

Further, resin substrates were adhered to the ultrathin copper foil sides of above heat treated samples by double-sided tape to thereby obtain single-sided copper-clad multilayer for measurement of the polyimide carrier peeling force.

(2) Samples for Confirmation of Pinholes

The ultrathin copper foils with carriers (Examples 1 to 9 and Comparative Examples 1 and 2) were cut into pieces each having a size of 250 mm in vertical direction and 250 mm in horizontal direction. Transparent tapes were adhered to the ultrathin copper foil sides. The ultrathin copper foils were peeled from the carrier foils to thereby obtain samples for confirmation of pinholes.

<Evaluation of Characteristics of Ultrathin Copper Foils>

(1) Method of Measurement of Carrier Peeling Force and Confirmation of Blistering (a) Confirmation of Blistering Whether or not the ultrathin copper foils on the carrier foils swelled up was visually examined. The number of blisters was counted. The results are shown in Table 1.

(b) Measurement of Carrier Peeling Force

The samples prepared according to the method of (1) described above were measured for carrier peeling force (peeling strength) for n=3 number of specimens by peeling off the ultrathin copper foils from the carrier foils with a measured specimen width of 10 mm according to the method prescribed in JIS C6511. The results of the evaluation are shown in Table 1.

(c) Confirmation of Pinholes

Light was irradiated against the pinhole measurement samples of the above (2) from their bottoms. The numbers of spots of light were counted and used as the numbers of pinholes.

TABLE 1

| | Diffusion prevention layer | Release layer forming metal A | Release layer forming metal B | Low melting point on release layer | Composition (%) | Carrier peeling force (KN/m) | Number of pin holes | Number of blisters measured |
|---|---|---|---|---|---|---|---|---|
| Ex 1 | Ni | Mo | Co | None | 31 | 0.06 | 2 | 1 |
| Ex 2 | Ni | Mo | Ni | None | 29 | 0.07 | 2 | 0 |
| Ex 3 | Ni | W | Ni | None | 20 | 0.05 | 1 | 0 |
| Ex 4 | Ni | Mo | Co | None | First layer: 56 Second layer: 23 | 0.02 | 0 | 0 |
| Ex 5 | Ni—Co | Mo | Co | None | 31 | 0.07 | 3 | 2 |
| Ex 6 | Ni—Co | Mo | Ni | None | 29 | 0.08 | 3 | 0 |
| Ex 7 | Ni—Co | W | Ni | None | 20 | 0.06 | 2 | 0 |
| Ex 8 | Ni—Co | Mo | Co | None | First layer: 56 Second layer: 23 | 0.025 | 0 | 0 |
| Ex 9 | Ni | Mo | Co | Exists | 31 | 0.04 | 1 | 0 |
| Comp. Ex. 1 | None | Cr | | None | — | 0.35 | 15 | 1 |
| Comp. Ex. 2 | None | Cr | | None | — | 0.03 | 2 | 14 |

<Results of Evaluation>

The ultrathin copper foil with the carrier of Comparative Example 1 had a high carrier peeling force and a few blisters. On the other hand, the ultrathin copper foil with the carrier of Comparative Example 2 had a low carrier peeling force and many blisters. In this way, the comparative examples exhibited the tendencies that the lower the carrier peeling force, the larger the number of blisters and the smaller the number of blisters, the higher the carrier peeling force.

Contrary to this, the ultrathin copper foils with carriers of the present invention had low carrier peel forces and few blisters.

Further, when comparing these according to whether or not there is a diffusion prevention layer, although the difference is small, the carrier peeling force tends to become higher when there is no diffusion prevention layer in comparison with a case where there is a diffusion prevention layer, but this is a level which does not cause a problem in practical use.

The ultrathin copper foils with carriers of the present invention are stabler in both of the blistering and carrier peeling force in comparison with the conventional ultrathin copper foils with carriers in which the principal ingredient of the release layer is Cr such as shown in the comparative examples.

Further, by providing two layers with different composition ratios of metals of the two ingredients forming the release layers and changing the composition ratio between the portion contacting the carrier foil side and the portion contacting the ultrathin copper foil, a more stable ultrathin copper foil with a carrier is obtained.

In the above examples, as release layers, use was made of layers of Mo—Co, Mo—Ni, and W—Ni, but other than these, the same effects are obtained even by combinations of Mo—Fe, V—Fe, V—Co, V—Ni, Mn—Fe, Mn—Co, Mn—Ni, W—Fe, and W—Co.

Further, in the present age where environmental problems have become serious, little or no Cr is used, therefore the ultrathin copper foil with the carrier of the present invention is environmentally friendly.

As explained above, the present invention can provide an ultrathin copper foil with a carrier suppressing the occurrence of blistering at the release layer interface without exerting an influence upon the carrier peeling force, friendly to the environment, and enabling easy peeling apart of the carrier foil and the ultrathin copper foil even when under a high temperature environment.

Further, the present invention has the excellent effect that a printed circuit board stable in production quality can be provided as the base of a printed circuit board for fine pattern applications using the ultrathin copper foil with the carrier, a multi-layer printed circuit board, a chip-on-film use circuit board, or the like.

While the invention has been described with reference to specific embodiments chosen for purpose of illustration, it should be apparent that numerous modifications could be made thereto by those skilled in the art without departing from the basic concept and scope of the invention.

The invention claimed is:

1. An ultrathin copper foil with a carrier comprising a carrier foil, a diffusion prevention layer, release layers, and an ultrathin copper foil, wherein said release layers are comprised of two layers having different composition ratios of a metal A for retaining a release property and a metal B for facilitating plating of the ultrathin copper foil, and, when the content in weight of the metal A constituting a release layer on the diffusion prevention layer side is c, the content in weight of the metal B thereof is d, the content in weight of the metal A constituting a release layer on the ultrathin copper foil side is e, and the content in weight of the metal B thereof is f, an equation of:

$$|c/(c+d)-e/(e+f)|*100 \geq 3$$

is satisfied.

2. An ultrathin copper foil with a carrier as set forth in claim 1, wherein the metal A constituting said release layers is selected from a group consisting of Mo, Ta, V, Mn, and W, and the metal B is selected from a group consisting of Fe, Co, and Ni.

3. A printed circuit board for high density ultrafine interconnect applications comprising an ultrathin copper foil with a carrier of claim 2 with the ultrathin copper foil laminated on a resin substrate.

4. An ultrathin copper foil with a carrier as set forth in claim 1, wherein a total of the amount of deposition of said release layers is 0.05 mg/dm$^2$ to 50 mg/dm$^2$.

5. A printed circuit board for high density ultrafine interconnect applications comprising an ultrathin copper foil with a carrier of claim 4 with the ultrathin copper foil laminated on a resin substrate.

6. A printed circuit board for high density ultrafine interconnect applications comprising an ultrathin copper foil with a carrier of claim 1 with the ultrathin copper foil laminated on a resin substrate.

* * * * *